United States Patent [19]
Yin

[11] Patent Number: 5,573,596
[45] Date of Patent: Nov. 12, 1996

[54] ARC SUPPRESSION IN A PLASMA PROCESSING SYSTEM

[75] Inventor: Gerald Z. Yin, Cupertino, Calif.

[73] Assignee: Applied Materials, Inc., Santa Clara, Calif.

[21] Appl. No.: 188,287

[22] Filed: Jan. 28, 1994

[51] Int. Cl.$^6$ .................................................. C23C 16/00
[52] U.S. Cl. ................... 118/723 E; 118/723 R; 118/723 HC
[58] Field of Search ............................ 118/723 R, 723 E, 118/723 HC; 156/345; 204/298.11, 298.15

[56] References Cited

U.S. PATENT DOCUMENTS

| | | | |
|---|---|---|---|
| 5,269,896 | 12/1993 | Munemasa | 204/192.38 |
| 5,334,298 | 8/1994 | Gegenwart | 204/192.12 |
| 5,380,558 | 1/1995 | Fujino | 427/255.5 |
| 5,382,339 | 1/1995 | Aranovich | 204/192.12 |
| 5,405,652 | 4/1995 | Kashiwagi | 427/282 |

FOREIGN PATENT DOCUMENTS 4220588  1/1994  Germany .

OTHER PUBLICATIONS

Patent Abstracts of Japan, vol. 10, No. 56 (C–331) [2113], 6 Mar. 1986 & JP-A-60 197873 (Nippon Shinku Gijutsu) 7 Oct. 1985–Abstract.

Patent Abstracts of Japan, vol. 18, No. 68 (C–1161), 4 Feb. 1994 & JP-A-05 279859 (Canon), 26 Oct. 1993–Abstract.

Database WPI–Week 8527–Derwent Publications Ltd., London, GB: AN 85-163189 & JP-A-60 094 724 (Nichiden Anelba), 27 May 1985–Abstract.

*Primary Examiner*—R. Bruce Breneman
*Assistant Examiner*—Joni Y. Chang
*Attorney, Agent, or Firm*—Michaelson & Wallace

[57] ABSTRACT

A reactive ion etching or magnetically enhanced reactive ion etching system consists of a cathode support structure, a shield structure disposed around the cathode, an insulator disposed between the cathode and the shield structure, and a clamping ring capable of mating with the top edge of the insulator. The insulator has a generally cylindrical shape with a flange that extends outward between the shield structure and the clamping ring. A gap between the clamping ring and the top edge of the insulator is controlled to 20 thousandths of an inch or less to restrict an RF coupling path between the shield and the cathode. In addition, the flange acts to interrupt the plasma conduction path between the shield structure and the cathode. By inhibiting plasma conduction between the shield and the cathode, reactive ion etching systems in accordance with the present invention operate in a higher pressure, higher power regime without arcing or exciting a secondary plasma.

30 Claims, 3 Drawing Sheets

ARC SUPPRESSION IN A PLASMA PROCESSING SYSTEM

FIELD OF THE INVENTION

The present invention relates to plasma-based processing systems and, in particular, to the reduction of arcing in such systems.

BACKGROUND OF THE INVENTION

Etching operations are frequently used in the formation of modern semiconductor devices. Typically, layers within device structures are formed by depositing a thin film layer of material on the semiconductor substrate, forming a photoresist mask on the thin film layer, and then removing the material left exposed by the photoresist mask in an etching step. A number of characteristics of the reactive ion etching (RIE) technique make it better suited to the extreme demands of modern device processing than many of other etching techniques. Because of the high level of directional selectivity achieved with reactive ion etching, its use enables device structures of greater density to be formed. In addition, the relatively low temperatures at which RIE is performed make such process steps compatible with even the later stages of device processing.

The process of forming a photoresist mask and then etching to remove material is repeated many times in the formation of semiconductor devices. Thus, the etching process has a substantial impact on the processing time required to produce semiconductor devices, as well as on the yields for those processes. As with many of the processing steps employed to form modern semiconductor devices, there is a need to reduce the time needed for etching steps so that process throughput can be increased. There is a similar need to improve the reliability and predictability of etching processes.

Reactive ion etching, and the related technique of magnetically enhanced reactive ion etching (MERLE), removes that portion of a thin film layer not protected by a photoresist mask through a combination of physical bombardment, chemical etching and chemical deposition. In these reactive ion etching processes, a chemical etchant from a plasma created above the etching substrate is transferred to and then absorbed onto the surface of the material to be etched. Ion bombardment provides additional energy to bring the absorbed etchant species to a higher energy state and to accelerate the surface reaction. Chemical etchants are typically chosen so that etching occurs predominantly at the exposed portions of the thin film layer rather than on the surfaces of the photoresist mask. Reacted material, which is typically volatile, is removed from the surface of the device through a vacuum exhaust line. An RIE or MERLE system typically uses a single, RF-powered cathode for generating a capacitively coupled plasma. Accordingly, the etching system walls, including the top lid, are typically grounded in such a system to define the extent of the RF field and the region in which a plasma is generated.

Optimizing the reactive ion etching environment typically includes optimizing the operational pressure within the etching chamber. When chlorine chemistry (e.g., based on $Cl_2$), fluorocarbon chemistry, or other, similar chemistry is used in the etching system, it is desirable to operate at relatively high pressures (between about 100 milliTorr and about 250 milliTorr) to obtain a good balance between the effects of physical bombardment and chemical etching. When chemically strong etchants, such as $SF_6$ or $NF_3$, are used, lower pressure operation is desirable. Higher operating pressures can increase both the density of etchants within the plasma and the rate of transport of etchants to the surface of the etching substrate. In many circumstances, higher operating pressures may improve the selectivity between the photoresist mask and the material being etched. Higher operating pressures require a correspondingly higher level of RF power input to maintain a suitable DC bias to obtain good etch profiles. RIE and MERLE systems also exhibit greater stability and reduced etch residues at higher operating pressures.

Two types of cathode structures are typically used to deliver RF power into reactive ion etching systems. The "isolated cathode" structure uses a cathode separated from the chamber walls primarily by insulation. Although this cathode structure is simple and relatively reliable, the RF power input to the cathode may couple to the chamber wall through vacuum, giving rise to an undesirable secondary plasma. A second type of cathode structure places a shielding structure between the cathode and the walls of the etching system. In typical implementations of this "shielded cathode" design, a shield, typically in the form of a grounded cylinder, is placed around the cathode. An insulating cylinder, also typically cylindrical, physically and electrically separates the cathode from the shield. The grounded shield prevents the creation of a secondary plasma between the cathode and the walls of the etching chamber. Under some conditions, however, arcing may occur between the RF-powered cathode and the grounded shield. In particular, high operating pressure and high RF input power often causes arcing, probably because of the high potential drop over the short distance between the powered cathode and the grounded shield. The thinner plasma sheath associated with high pressure, high input power operation may make the generation of a secondary plasma more likely in the narrow space between the RF-powered cathode and the grounded shield.

SUMMARY OF THE PREFERRED EMBODIMENTS

One preferred embodiment of the present invention is an etching system including a cathode capable of exciting a plasma. A shield structure, which may be maintained at an electrical potential different from the cathode, is disposed adjacent to and about at least a portion of the cathode. An insulating structure is disposed between the cathode and shield. Any gaps within the insulating structure, or between the insulating structure and the cathode or shield, which may define a gas conduction path between the cathode and shield, are limited over at least a portion of any such gas conduction path to less than the threshold thickness which would allow the generation of a secondary plasma.

Another preferred embodiment of a reactive ion etching system in accordance with the present invention includes a cathode coupled to a high frequency power source capable of exciting a plasma. A shield structure is disposed adjacent to at least a portion of the cathode, and the shield structure can be maintained at an electrical potential different from the cathode. An insulating structure is disposed between the cathode and the shield structure so that an edge of the insulating structure extends beyond either a surface of the cathode or an edge of the shielding structure. The edge of the insulating structure has a cap disposed upon it so that the cap defines at least a portion of a gas conduction path between the shield structure and the cathode. A flange extends from the insulating structure to interrupt the gas conduction path.

In another preferred embodiment of the present invention, a cathode is coupled to a high frequency power source capable of exciting a plasma. A shield structure is disposed adjacent to at least a portion of the cathode, and the shield structure is maintained at an electrical potential different from the cathode. An insulating structure is disposed between the cathode and the shield structure so that an edge of the insulating structure extends beyond either a surface of the cathode or an edge of the shielding structure. A cap structure is disposed adjacent to an edge of the cathode and is fitted to the insulating structure so that the cap structure is separated from the insulating structure by a sufficiently thin gap so that a secondary plasma is not generated within said gap at operating pressures in excess of 150 milliTorr. In a further aspect of this preferred embodiment, a gap equal to or less than 20 thousandths of an inch separates the cap structure from the edge of the insulating structure.

In yet another preferred embodiment of the present invention, a cathode is coupled to a high frequency power source capable of exciting a plasma. A shield structure is disposed adjacent to at least a portion of the cathode, and the shield structure is maintained at an electrical potential different from the cathode. An insulating structure is disposed between the cathode and the shield structure so that an edge of the insulating structure extends beyond either a surface of the cathode or an edge of the shielding structure. The etching system further includes means for restricting plasma conduction between the cathode and the shield structure at operating pressures of 150 milliTorr or greater.

DETAILED DESCRIPTION OF THE PREFERRED EMBODIMENTS

The present invention generally relates to reactive ion etching (RIE) systems and magnetically enhanced reactive ion etching (MERIE) systems. For convenience, these systems will be collectively referred to herein as reactive ion etching (RIE) systems. Prior art RIE systems are typically unable to maintain the higher operating pressures that are desirable for greater operating stability, improved etching rates, improved selectivity, and reduced residue levels. The present inventor has identified what is believed to be the primary mechanism for electrical breakdown in the shielded cathode configuration of prior art RIE systems. Apparently, a mechanical fitting becomes sufficiently loose during normal operation so as to allow ionized gas to flow between the system cathode and a grounded shielding structure within the system. By lengthening or restricting the path along which the ionized gas (i.e., the plasma) must travel to conduct electricity, the likelihood that breakdown will occur by this mechanism can be greatly reduced, allowing for higher pressure operation in a shielded cathode RIE system. In a preferred embodiment of the present invention, the plasma conduction path can be interrupted by extending an insulating flange to divert plasma flow away from the normal conduction path between the cathode and the shielding structure. In another preferred embodiment of the present invention, the plasma conduction path is restricted by reducing the size of the gap between the insulating structure and the clamping ring structure used to hold the etching substrate in place. By substantially improving the machining tolerances for this mechanical joint, the likelihood of creating a sufficient plasma conduction path to allow arcing to occur is greatly reduced.

Figure 1:
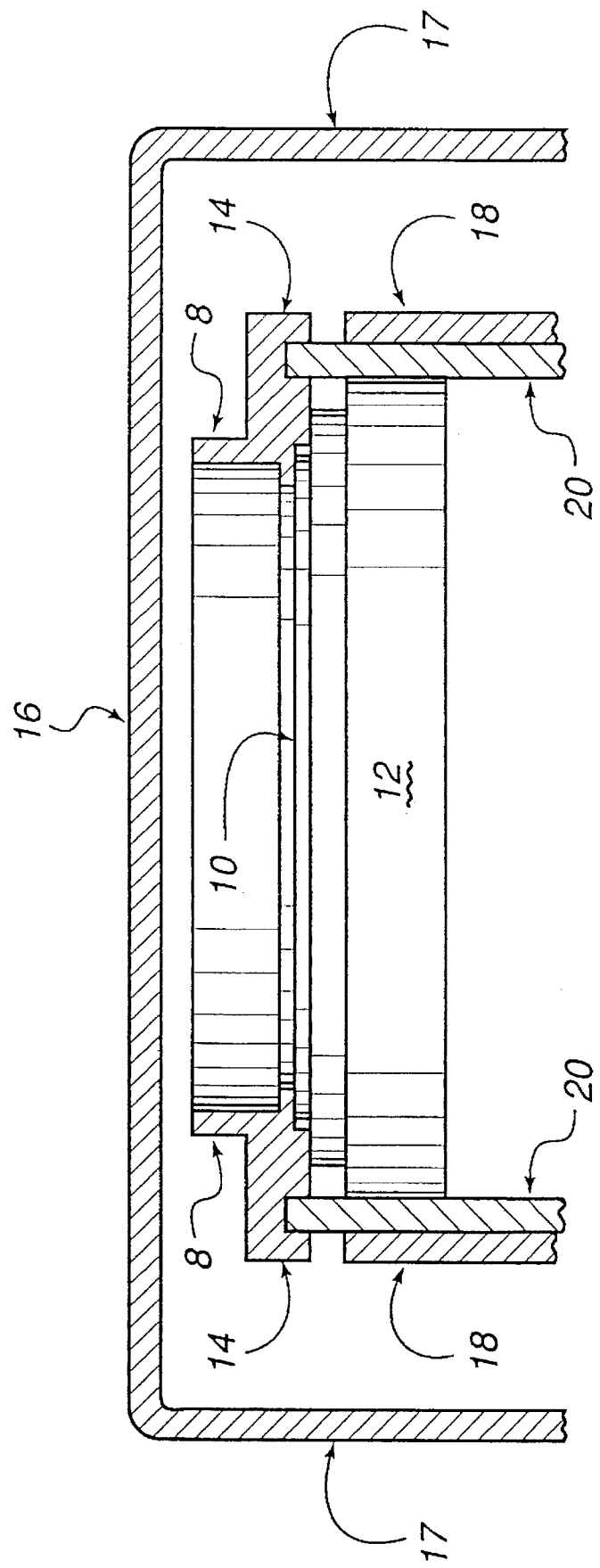
FIG. 1 is a cross section of a prior art reactive ion etching system.

FIG. 1 illustrates a prior art RIE system in cross section. The illustrated etching system consists of an etching substrate 10 disposed on a support structure 12. Most often, the etching substrate 10 is a semiconductor wafer at some intermediate stage of processing. The etching substrate is preferably mounted in a temporary but rigid manner with respect to the support structure 12. For example, the support structure may be an electrostatic chuck that holds the etching substrate in place by inducing a large electrostatic attraction between the dielectric etching substrate and a charge established within the electrostatic chuck. Alternatively, the etching substrate may be held in place by a clamping ring 14, as illustrated in FIG. 1.

During etching operations, the support structure 12 preferably acts as a cathode for the etching system. Generally, the anode for the system is primarily the upper surface 16 (i.e., the lid) of the etching chamber, but the walls 17 of the etching chamber also act as part of the system anode. Both the lid 16 and the walls 17 of the etching chamber are preferably grounded. In operation, a molecular gas such as $BCl_3$, $Cl_2$, HBr, $SF_6$, $C_2F_6$ or $CF_4$ is introduced to the region between the cathode 12 and the lid 16 of the etching chamber. RF power is applied to the cathode 12, so that the RF power capacitively couples to and excites the molecular gas, partially or completely ionizing the gas to create a plasma. The molecular gas is chosen so that it ionizes to yield an etchant species that is suitable to etch the desired material from the surface of the etching substrate 10. The difference between the surface area of the cathode 12 and the surface area of the lid 16 and walls 17 of the etching chamber (collectively the system anode) means that the etching system's RF circuit is asymmetric. Consequently, when RF power is applied to the cathode, a DC bias will be induced on the cathode. This induced DC bias is typically negative and tends to accelerate positive ions toward the etching substrate. An additional DC field may also be applied to further accelerate the ionized etchant gases toward the etching substrate 10. The induced and applied DC fields improve the etching rate by increasing the transport of etchant to the surface of the etching substrate 10 and by increasing the kinetic energy of the etchant molecules reaching the surface of the etching substrate.

High plasma density and high ionization levels are favorable to improved etching rates. Producing a high density plasma or a high ionization level requires very high input power levels. As a practical matter, the plasma for etching must be contained within a well-defined region of the processing chamber. If the plasma is not adequately contained, there may be insufficient power density to maintain the plasma, even if powerful RF generators are used to excite the plasma. To facilitate the formation of a stable plasma, a number of measures are taken within the processing environment to contain both the plasma itself as well as the electric field used to create the plasma. Often, the lid 16 of the etching chamber and the support structure 12 are spaced closely together and the plasma gases may be physically confined in other manners. For example, a ring 8 may extend from the clamping ring 14 to partially confine the plasma gas within the region adjacent to the etching substrate 10.

In shielded cathode RIE systems, the RF electric field used to create the plasma is also contained to prevent power dissipation in ways that do not contribute to the formation of an etching plasma. An example of such containment is illustrated in FIG. 1. A shield structure 18 is disposed around the cathode support structure 12 to contain the RF driving field. The shield structure 18 is typically disposed as closely as possible to the cathode support structure 12 and is generally maintained at ground potential. Accordingly, the shield structure 18 also acts, to some extent, as an anode for the reactive ion etching system. The close proximity of the shield structure 18 to the cathode support structure 12, coupled with the presence of ionized gases from the plasma, makes electrical conduction between the shield structure 18 and the cathode support structure 12 likely unless appropriate measures are taken. Such electrical conduction is an effective short circuit, allowing the input RF power to be drawn away and causing the plasma to break down.

To prevent conduction between the shield structure 18 and the cathode support structure 12, a dielectric insulator 20 is disposed between shield structure 18 and the cathode support structure 12. Often the dielectric insulator 20 is formed from quartz because of the durability, toughness and good insulating properties of quartz. Other dielectric materials can also be used, including such dielectric ceramics as alumina. For the geometry shown in FIG. 1, the dielectric insulator 20 has a cylindrical or pipe-like shape. In addition to providing a dielectric insulator 20 between the shield structure 18 and the cathode support structure 12, it is typical to use a close fitting cap over the dielectric insulator 20 to further electrically isolate the shield structure 18 and the cathode support structure 12. For example, when a clamping ring structure is used, the clamping ring 14 may be formed with a groove having a rectangular cross section that mates with the edge of the dielectric insulator 20. The joint between the dielectric insulator 20 and the clamping ring 14 illustrated in FIG. 1 is shown in greater detail in FIG. 2. Here, and in all of the figures discussed herein, the same numbers are used to indicate the same or similar components of the illustrated systems.

Figure 2:
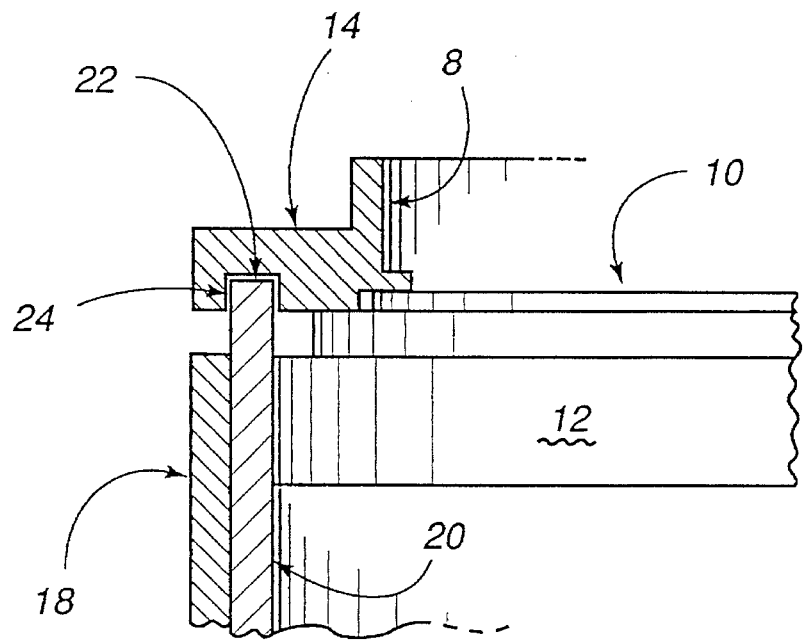
FIG. 2 is a detailed view of a portion of the reactive ion etching system of FIG. 1.

FIG. 2 illustrates the mechanical joint between shield structure 18, dielectric insulator 20, cathode support structure 12 and clamping ring 14. A channel 22 having a rectangular cross section is formed in clamping ring 14 to fit over the edge of the dielectric insulator 20 that extends above the shield structure 18 and the edge of the cathode 12. The channel 22 is designed to fit around the edge of the dielectric insulator 20. Using the clamping ring 14 as an end cap for the dielectric insulator 20 has the effect of further electrically isolating the shield structure 18 from the cathode support structure 12. However, the gap 24 which is left between the channel 22 and the edge of the dielectric insulator 20 upon assembly of the clamping ring 14 to the dielectric insulator 20, generally has not been well controlled in embodiments of the FIG. 1 geometry. Consequently, the typical gap 24 has ordinarily been on the order of between about 40 and 60 thousands of an inch.

Despite the measures taken to electrically isolate the cathode support structure 12 from the shield structure 18 and to contain the plasma field within the region in which the etching operation is to be performed, existing reactive ion etching systems cannot be reliably operated at high pressures. For example, the use of pressures above about 150 milliTorr results in plasma instability and arcing in existing shielded cathode designs of reactive ion etching systems. Table I illustrates the arcing problems of an RIE system of the general configuration indicated by FIG. 1. This Table shows the level of DC bias (in Volts) induced on the cathode for a variety of different input RF power levels for a number of different operating pressures. Either two or three trials were made at each combination of input RF power and operating pressure. Typical DC biases for non-arcing conditions are between −300 V and −500 V. The shaded boxes indicate trials in which arcing was observed within the 50 second trial period.

TABLE 1

| DC BIAS (Volts) - PRIOR ART CONFIGURATION | | | | | |
| --- | --- | --- | --- | --- | --- |
| PRESSURE | RF Power Input to Target | | | | |
| (mTorr) | 400 W | 450 W | 500 W | 550 W | 600 W |
| 150 | −448 | −465 | −497 | −540 | −540 |
|  | −450 | −465 | −504 | −530 | −540 |
|  |  |  |  | −540 | −540 |
| 200 | −150 | −392 | −140 | −134 | −100 |
|  | −380 | −398 | −420 | −430 | −100 |
|  |  |  | −418 | −134 |  |
| 250 | −320 | −340 | −140 | −100 |  |
|  | −320 | −340 | −356 | −370 |  |
|  |  |  |  | −100 |  |
| 300 | −260 | −290 | −138 | −100 |  |
|  | −113 | −295 | −308 | −320 |  |
|  |  |  | −305 | −330 |  |

Previous efforts have been unable to improve upon the performance indicated in Table 1. The present inventor has identified what is believed to be the most common breakdown path in existing shielded cathode reactive ion etching systems. By reducing the likelihood of electrical breakdown along this path, the present invention overcomes some of the disadvantages of existing reactive ion etching systems. The resulting system has achieved stable operation at considerably higher operating pressures and has achieved greater stability at those pressures than has been obtained with existing reactive ion etching systems.

The present inventor has observed that in existing shielded cathode etching systems, the shield structure 18 is insufficiently insulated from the cathode support structure 12, giving rise to the arcing and plasma breakdown indicated in Table 1. The present inventor has determined that, despite the presence of an insulating structure 20 and the presence of an isolating clamping ring structure 14, electrical breakdown occurs in shielded cathode etching systems by plasma conduction between the shield structure 18 and the cathode support structure 12. This conduction is mediated by the presence of ionized gas within a gap 24, indicated in FIG. 2, between the clamping ring channel 22 and the dielectric insulator 20. In existing RIE systems, the channel 22 is typically machined so that the gap 24 remains on the order of between 40 and 60 thousandths of an inch. Gap 24 may open further during the normal operation of the reactive ion etching system due to the differential thermal expansion of components of the etching system. During normal operation of the reactive ion etching system, all of the components of the etching system are heated to some extent. The heating and the absorption of heat need not be uniform between the various components of the system. Thus, different components of the system may be heated to different temperatures. The differing temperatures of different system components, as well as the differing thermal expansion coefficients of these different system components, may lead even closely fitting mechanical joints to separate in the normal course of operation. Thus, a gap 24 may arise between the channel 22 and the edge of the dielectric insulator 20 during normal operation regardless of how closely the channel 22 fits around the edge of the dielectric insulator 20 at room temperature.

Whether the gap arises from poor machining tolerances or because of differential thermal expansion, this gap is larger than the threshold width necessary for the generation of a secondary plasma at high operating pressures and high input powers. In other words, as the operating pressure and power are increased, the thickness of the plasma sheath decreases sufficiently so as to fit within the gap. If the gap 24 is larger than a threshold width during operation of the etching system, a gap 24 extending from the shield structure 18 to the cathode support structure 12 will eventually contain sufficient ionized gas to maintain conduction between the shield and the cathode. When a secondary plasma is generated within the gap 24, arcing occurs and current flows between the cathode and the shield, draining the input RF power away from the primary plasma and causing the primary plasma to break down.

Figure 3:
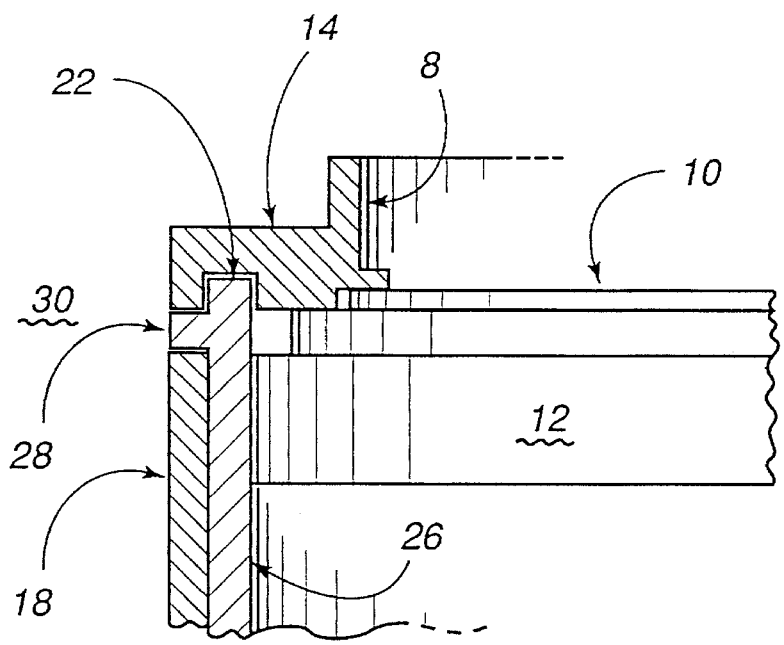
FIG. 3 is a detailed view of a portion of a reactive ion etching system in accordance with the present invention.

The present invention is directed to reducing the possibility of electrical conduction between the shield structure 18 and the cathode support structure 12. A preferred embodiment of the present invention is illustrated in FIG. 3, which is an expanded cross sectional view of the junction between a shield structure 18, cathode support structure 12, clamping ring 14 and dielectric insulator 26. Typically, it is preferred that the joint between the clamping ring 14 and the dielectric insulator 26 be machined to higher tolerances than in the prior art system. The gap 24 is controlled to within approximately 10 to 20 thousandths of an inch. By maintaining higher tolerances between the components of the etching system, the gap 24 will be smaller than the threshold width necessary to support the generation of a secondary plasma, even for high operating pressures and high RF power input.

In some preferred embodiments of the present invention, a flange 28 extends from the dielectric insulator 26 between the clamping ring 14 and the shield structure 18. It is believed that the flange 28 has the effect of interrupting the gas conduction path from the shield structure to the cathode support structure. This interruption may arise from the flange 28 acting to substantially block the gas conduction path or to divert the gas conduction path through a region with a low density of ionized gas and a reduced level of RF power. Because little of the plasma excitation field should be present in the region 30 adjacent to the outer edge of the clamping ring 14, which is disposed away from the plasma excitation region, no secondary plasma should be generated in the region 30. Accordingly, if the flange 28 acts to divert the gas conduction path into the region 30, the ionized gas flowing through the channel 22 will be diluted in the region 30, greatly reducing the possibility of electrical conduction between the shield structure 18 and the cathode support structure 12. From a different perspective, the flange 28 may effectively increase the length of the conduction path between the shield structure 18 and the cathode support structure 12, increasing the impedance to electrical conduction between the shield 18 and the cathode 12.

FIG. 3 illustrates the flange 28 as extending to be flush with the edge of the clamping ring 14, but in practice the flange 28 may extend beyond the extent of either the clamping ring 14 or the shield structure 18. The extent of the flange 28 is limited by the space available within the reactive ion etching chamber. In some circumstances, where either the gas conduction path is sufficiently blocked or diverted, the flange need not extend to be flush with either the clamping ring 14 or the shield structure 18. FIG. 3 illustrates a preferred embodiment of the present invention in which the flange 28 has a generally rectangular cross section. Other shapes are useful in practicing the present invention. The particular shape employed for the flange 28 will often depend on the geometry of the edge of the shield structure 18 and of the clamping ring 14. It is preferred that the shape of the flange be chosen to divert or block the gas conduction path between the electrode shield 18 and the cathode support structure 12.

Figure 4:
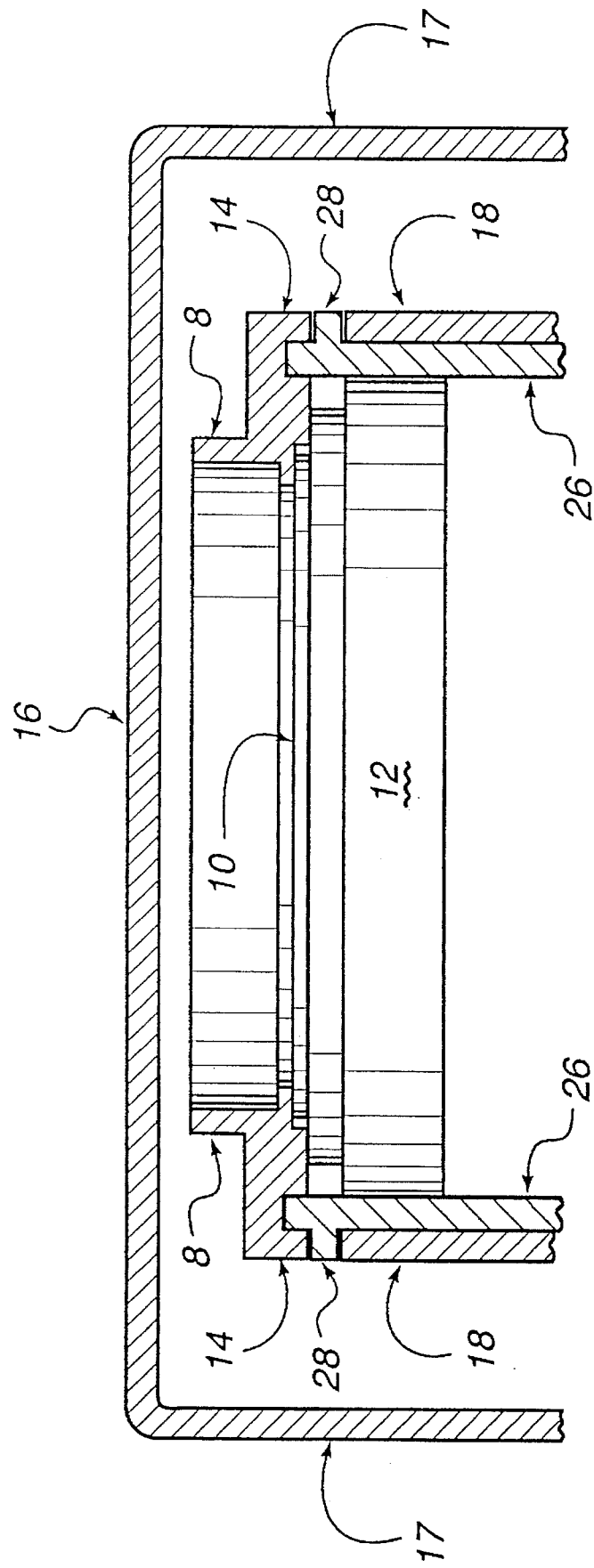
FIG. 4 is a cross section of a reactive ion etching system in accordance with the present invention.

FIG. 4 illustrates a preferred embodiment of the present invention. Here, the dielectric insulator 26 preferably comprises a quartz cylinder with a flange 28 extending outwardly from the surface of the quartz cylinder. The flange 28 may be formed by machining the quartz cylinder, or it may be formed by "welding" the flange structure to the surface of the quartz by any of the well-known methods for working quartz. Structures other than a flange could also be used, so long as the structure functions to interrupt the gas conduction path between the shield structure 18 and the cathode support structure 12. In addition, the present invention may also be implemented in reactive ion etching systems where a structure other than a clamping ring is used as a cap for the dielectric insulator.

Table 2 illustrates the improved performance achieved by an RIE system in accordance with the present invention. As with Table 1, Table 2 shows the level of DC bias (in Volts) induced on the cathode for a variety of different input RF power levels for a number of different operating pressures. The numbers in Table 2 are averages of three trials made at each combination of input RF power and operating pressure. No arcing was observed for any of the combinations of operating pressures and input RF power for any of the trials.

TABLE 2

| DC BIAS (Volts) - PRESENT INVENTION | | | | | | |
|---|---|---|---|---|---|---|
| PRESSURE | RF Power Input to Target | | | | | |
| (mTorr) | 400 W | 450 W | 500 W | 550 W | 600 W | 650 W |
| 150 | −372 | −411 | −447 | −477 | −508 | −543 |
| 200 | −321 | −358 | −391 | −422 | −452 | −476 |
| 250 | −275 | −305 | −341 | −371 | −398 | −426 |
| 300 | −245 | −273 | −295 | −324 | −352 | −375 |
| PRESSURE (mTorr) | 700 W | 750 W | 800 W | 850 W | 900 W | 950 W |
| 150 | −562 | −593 | −616 | −637 | −660 | −658 |
| 200 | −504 | −531 | −558 | −580 | −594 | −591 |
| 250 | −455 | −473 | −501 | −518 | −518 | −553 |
| 300 | −401 | −426 | −451 | −462 | −462 | −504 |

By modifying the reactive ion etching system in accordance with the present invention, higher gas pressures can be maintained in the processing chamber. Tests on a reactive ion etching system as illustrated by FIG. 4 have demonstrated stable operation at gas pressures of 300 milliTorr for a wide range of input powers. This represents a marked improvement over the system illustrated by FIG. 1, which demonstrates stable operation only at pressures of 150 milliTorr or lower. Similarly, the present invention allows reactive ion etching systems to operate with higher plasma power inputs and the consequential increase in the density of ionized gas. For example, the system illustrated by FIG. 4 demonstrated stable operation at input powers of up to 950 Watts at gas pressures as high as 300 milliTorr. By contrast, the FIG. 1 system demonstrated stable operation only up to about 600 Watts of input power at a gas pressure of only 150 milliTorr. By obtaining such higher pressure or higher power operation, a reactive ion etching system in accordance with the present invention is capable of attaining higher etching rates, reduced etch residue, better photoresist selectivity, and an overall more stable etching process.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. An etching system defining a controlled subatmospheric environment containing ionizable gas, and for use with a high frequency power source, comprising:

a cathode within said controlled subatmospheric environment coupled to the high frequency power source and capable of exciting a plasma;

a shield structure disposed adjacent to and about at least a portion of said cathode, wherein said shield structure may be maintained at an electrical potential different from said cathode; and an insulating structure disposed between said cathode and shield structure, with any gaps within said insulating structure, or between said insulating structure and said cathode or shield structure, which may define a gas conduction path between said cathode and shield structure being limited over at least a portion of any such path to less than the threshold thickness which would allow the generation of a secondary plasma within such a path.

2. An etching system as in claim 1, in which said insulating structure between said cathode and shield structure extends outwardly at least to the outer perimeter of said shield structure.

3. An etching system as in claim 1, wherein the thickness of any said gap is limited to less than about twenty thousandths of an inch over at least a portion of said path.

4. An etching system as in claim 1, wherein said controlled subatmospheric environment is maintained at a pressure of less than about 250 milliTorr.

5. An etching system as in claim 1, wherein said controlled subatmospheric environment is maintained at a pressure within the range of greater than about 150 milliTorr to about 300 milliTorr.

6. An etching system as in claim 5, wherein the power input by said high frequency power source to said cathode is in excess of 600 Watts.

7. An etching system comprising:

a high frequency power source;

a cathode coupled to said high frequency power source so that said cathode is capable of exciting a plasma in a region adjacent to said cathode;

a shield structure disposed adjacent to and enclosing at least a portion of said cathode, wherein said shield structure may be maintained at an electrical potential different from said cathode; and an insulating assembly disposed between said cathode and said shield structure, said insulating assembly having a projecting portion extending at least to the outer perimeter of said shield structure, wherein said insulating assembly defines one or more gaps therein, or between said insulating assembly and said cathode or said shield structure, said one or more gaps comprising at least a portion of a gas conduction path between said shield structure and said cathode, and wherein said projecting portion of said insulating assembly interrupts said gas conduction path.

8. The etching system of claim 7 wherein the thickness of at least a portion of said gas conduction path is less than the threshold thickness necessary to allow the generation of a secondary plasma within said at least a portion of said gas conduction path.

9. The etching system of claim 7 wherein the thickness of at least a portion of said gas conduction path is less than about twenty thousandths of an inch.

10. The etching system of claim 7 wherein said insulating assembly substantially blocks said gas conduction path between said shield structure and said cathode.

11. The etching system of claim 7 wherein said insulating assembly acts to divert said gas conduction path through a region having a low density of ionized gas.

12. The etching system of claim 7 wherein said insulating assembly comprises a substantially cylindrical body of dielectric material and wherein said projecting portion of said insulating assembly has a generally rectangular cross section.

13. The etching system of claim 12 wherein said projecting portion of said insulating assembly extends beyond both the perimeter of said cathode and the perimeter of said shield structure.

14. An etching system comprising:

a high frequency power source;

a cathode coupled to said high frequency power source so that said cathode is capable of exciting a plasma in region adjacent to said cathode;

a shield structure disposed adjacent to at least a portion of said cathode, wherein said shield structure may be maintained at an electrical potential different from said cathode;

an insulating structure disposed between said cathode and said shield structure, said insulating structure having an edge extending beyond either an edge of said cathode or an edge of said shield structure; and a cap structure disposed adjacent to an edge of said cathode, wherein said cap structure is fitted to said edge of said insulating structure so that said cap structure is separated from said edge of said insulating structure by a sufficiently thin gap so that a secondary plasma is not generated within said gap at operating pressures in excess of 150 milliTorr.

15. The etching system of claim 14 wherein said cap structure comprises a channel disposed about said edge of said insulating structure.

16. The etching system of claim 14 wherein said gap is less than about 20 thousandths of an inch.

17. The etching system of claim 14 further comprising a flange extending from said insulating structure between said cap structure and said edge of said shield structure.

18. The etching system of claim 17 wherein said insulating structure comprises a substantially cylindrical body of dielectric material and wherein said edge of said insulating structure has a generally rectangular cross section.

19. The etching system of claim 17 wherein said edge of said insulating structure extends beyond both said edge of said cathode and said edge of said shield structure.

20. The etching system of claim 18 wherein said cap structure comprises a clamping ring for holding a semiconductor wafer on a surface of said cathode during an etching operation.

21. The etching system of claim 20 wherein said insulating structure and said flange comprise quartz.

22. The etching system of claim 17 wherein said cap structure comprises a channel having a generally rectangular cross section capable of mating to said edge of said insulating structure.

23. The etching system of claim 17 wherein a surface of said flange is disposed adjacent to said cap structure and wherein another surface of said flange is disposed adjacent to said shield structure.

24. The etching system of claim 23 wherein said flange has a generally rectangular cross section and wherein a surface of said flange is flush with a surface of said shield structure.

25. A shielded cathode etching system comprising:
 a cathode coupled to a high frequency power source capable of exciting a plasma;
 a shield structure disposed adjacent to at least a portion of said cathode, wherein said shield structure may be maintained at an electrical potential different from said cathode;
 an insulating structure disposed between said cathode and said shield structure, said insulating structure comprising,
  an edge extending beyond either an edge of said cathode or an edge of said shield structure, and
 means for restricting plasma conduction between said cathode and said shield structure at operating pressures of 150 milliTorr or greater; and
 means for temporarily holding a substrate in place during an etching operation.

26. The shielded cathode etching system of claim 25 wherein said means for restricting plasma conduction comprises means for restricting plasma conduction at input RF power levels in excess of 500 Watts.

27. The shielded cathode etching system of claim 25 wherein said means for restricting plasma conduction comprises a dielectric structure disposed so as to substantially block plasma conduction between said cathode and said shield structure.

28. The shielded cathode etching system of claim 25 wherein said means for restricting plasma conduction comprises a dielectric structure defining a gas conduction path between said cathode and said shield structure.

29. The shielded cathode etching system of claim 28 wherein at least a portion of said gas conduction path has a width smaller than a threshold width.

30. The shielded cathode etching system of claim 28 wherein at least a portion of said gas conduction path has a width smaller than about twenty thousandths of an inch.

* * * * *